(12) United States Patent
Chang et al.

(10) Patent No.: US 6,295,229 B1
(45) Date of Patent: Sep. 25, 2001

(54) SEMICONDUCTOR DEVICE AND METHOD OF OPERATING IT

(75) Inventors: Kuo-Tung Chang; Erwin J. Prinz; Craig T. Swift, all of Austin, TX (US)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 09/351,742

(22) Filed: Jul. 8, 1999

(51) Int. Cl.$^7$ .................................................. G11C 16/04
(52) U.S. Cl. .............................. 365/185.28; 365/185.26; 365/185.01
(58) Field of Search ........................ 365/185.28, 185.01, 365/185.26, 185.14, 185.95, 185.05

(56) References Cited

U.S. PATENT DOCUMENTS

| | | | |
|---|---|---|---|
| 4,302,766 | 11/1981 | Guterman et al. | 357/41 |
| 4,882,750 | 11/1989 | Henderson et al. | 379/355 |
| 5,049,515 | 9/1991 | Tzeng | 437/43 |
| 5,471,422 | 11/1995 | Chang et al. | 365/185.26 |
| 5,646,060 | 7/1997 | Chang et al. | 437/43 |
| 5,706,228 | 1/1998 | Chang et al. | 365/185.18 |
| 5,965,913 | * 10/1999 | Yuan et al. | 257/321 |
| 5,981,340 | * 11/1999 | Chang et al. | 438/258 |
| 6,114,724 | * 9/2000 | Ratnakumar | 257/326 |

* cited by examiner

Primary Examiner—David Nelms
Assistant Examiner—Thong Le

(57) ABSTRACT

A semiconductor device (70) includes a memory cell having a select transistor (67) and a storage transistor (65) having a relatively uniform tunnel dielectric thickness under both the floating gate (651) of the storage transistor and the select gate (671) of the select transistor (67). The select transistor (67) is adjacent to the drain region (68) for the memory cell to nearly eliminate a drain disturb problem. During programming, the control gate (652) is at a negative potential, and the drain region (68) is at a positive potential. The drain potential is sufficiently low to not degrade the tunnel dielectric layer (42) of the select transistor (67). During erase, a positive potential is applied to the control gate (652). The relatively uniform tunnel dielectric layer (42) thickness of the select transistor (67) allows for a faster operating device by increasing the read current of the memory device.

12 Claims, 3 Drawing Sheets

| | SOURCE | SELECT GATE | CONTROL GATE | DRAIN |
|---|---|---|---|---|
| PROGRAM | 0V | 0V | −10V | 6V |
| ERASE | 0V | 0V | 12V | 0V |
| READ | 0V | $V_{DD}$ | 1V | 1V |

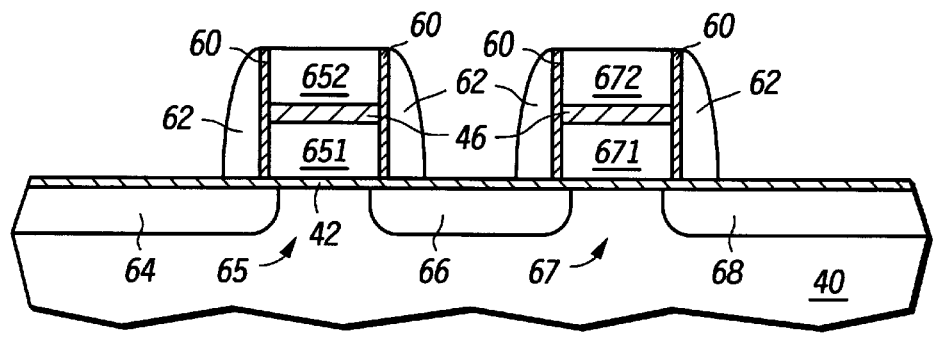
*FIG.6*
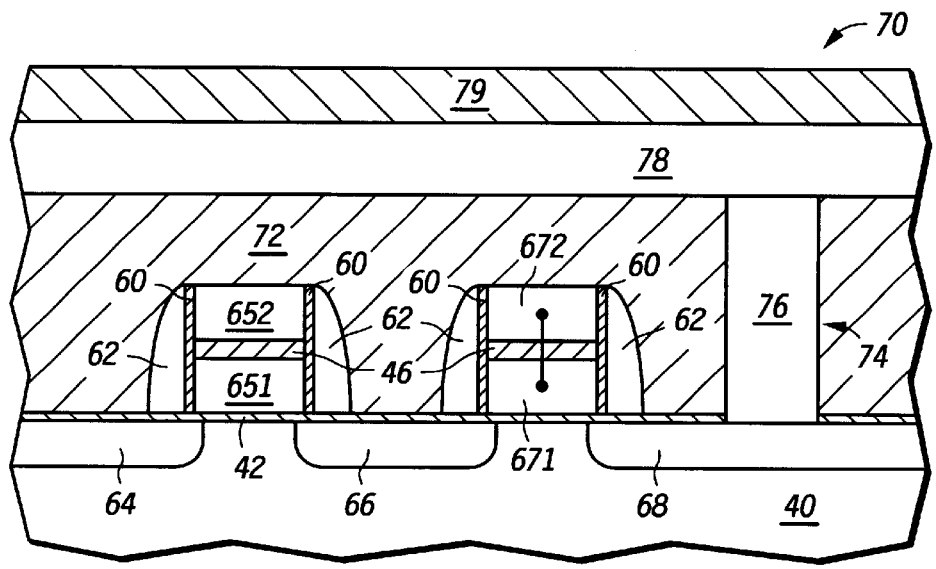
*FIG.7*
|  | $V_{CG}$ | $V_{SG}$ | $V_D$ | $V_S$ | $V_{WELL}$ |
|---|---|---|---|---|---|
| PROGRAM SELECTED | −12 | 5V | 3V | 0V | 0V |
| PROGRAM UNSELECTED | 0V | 0V | 3V | 0V | 0V |
| ERASE | 13V | $V_{DD}$ | 0V | 0V | 0V |
| READ | 1V | $V_{DD}$ | 1V | 0V | 0V |
*FIG.8*

SEMICONDUCTOR DEVICE AND METHOD OF OPERATING IT

RELATED APPLICATION

This is related to U.S. patent application Ser. No. 08/603,939 filed Feb. 20, 1996 now U.S. Pat. No. 5,706,228, and assigned to the assignee hereof.

FIELD OF THE INVENTION

This invention relates in general to semiconductor devices having memory cells, and more particularly, to such devices having floating gate memory cells and methods of forming and programming the same.

BACKGROUND OF THE INVENTION

Semiconductor devices can include electrically erasable and electrically programmable read only memory cells. One of the problems in using these devices has traditionally been having to incorporate relatively high potentials for programming or erasing the memory cells. As the potentials being supplied to the device are reduced, keeping the same thick dielectric layers for both a select transistor and a floating gate transistor become more difficult as this greatly impairs reading and writing times.

An attempt to address part of the high potential problems has been the use of a uniformly thick tunnel dielectric layer under both the select transistor and storage transistor. Referring to FIG. 1, a P-well 10 includes N+ doped regions 12,14, and 16 that are the source, drain/source and drain regions, respectively, for the memory cell 11. The memory cell 11 includes a storage transistor 29 and a select transistor 28. The storage transistor 29 has a floating gate 22, a control gate 26, and an intergate dielectric layer 24 between the floating gate 22 and the control gate 26. The transistor 28 has a select gate 20. The storage transistor 29 is where charge is stored for the memory cell and it is connected to the drain of the memory device. A tunnel dielectric layer 18 lies between the P-well 10 and the select and floating gates 20 and 22.

This particular device has been found to be susceptible to drain disturb problems during programming. The potentials for programming, erasing and reading this device are shown in FIG. 2. The drain region 16 is typically at a potential of approximately 6 volts during programming of the memory cell 11 and supplies about half the potential necessary for electron transport from the floating gate to the drain. However, this potential can disturb the data in other memory cells that are connected to the same drain bit line. More specifically, the unselected memory cells along the same column will have their control gates at approximately zero volts while the drain regions are at potentials of approximately 6 volts. Some electrons are ejected from floating gates that share the same bit line of other memory cells to their drains.

The drain disturb can be particularly problematic as implemented into an electrically erasable programmable read only memory (EEPROM) that is bit erasable or byte erasable. In these particular types of memory, the data in other cells can change relatively frequently while the data in one memory cell is not intentionally changed. However, the frequent programming of other memory cells sharing the same drain bit line can change an unselected bit from an unprogrammed state to a programmed state. This unintentional programming affects the reliability of the device.

Some prior art references include layouts where the select gate transistor is at the drain side of the memory cell and the dielectric layer for the select transistor is typically very thick. The thick dielectric is necessary because a very high potential is used on the select gate during programming to transmit the high drain voltage to the drain of the storage transistor. However, the thick gate dielectric layer causes the access time of the memory cell to be relatively long.

BRIEF DESCRIPTION OF THE DRAWINGS

The present invention is illustrated by way of example and not limitation in the accompanying figures, in which like references indicate similar elements, and in which:

FIGS. 4–7 include illustrations of cross-sectional views of a portion of a semiconductor device substrate during the fabrication of a semiconductor device in accordance with an embodiment of the present invention; and FIG. 8 includes a table of programming, erasing and reading parameters in accordance with the embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiment(s) of the present invention.

DETAILED DESCRIPTION

A semiconductor device includes a memory cell having a select transistor and a storage transistor having a relatively uniform tunnel dielectric thickness under both the floating gate of the storage transistor and the select gate of the select transistor. The select transistor is adjacent to the drain region for the memory cell to nearly eliminate a drain disturb problem during the programming of other memory cells connected to the same drain bit line. During programming, the potential between control gate and drain is divided between a negative potential on the control gate and a positive potential on the drain. The drain potential is sufficiently low to not degrade the tunnel dielectric layer of the select transistor. During erase, a positive potential is applied to the control gate. The relatively uniform tunnel dielectric layer thickness of the select transistor allows for a faster operating device by increasing the read current of the memory device. The present invention is better understood with the details in fabricating and operating the device as will be described below.

MEMORY CELLS AND THEIR FORMATION

Figures 1, 2:
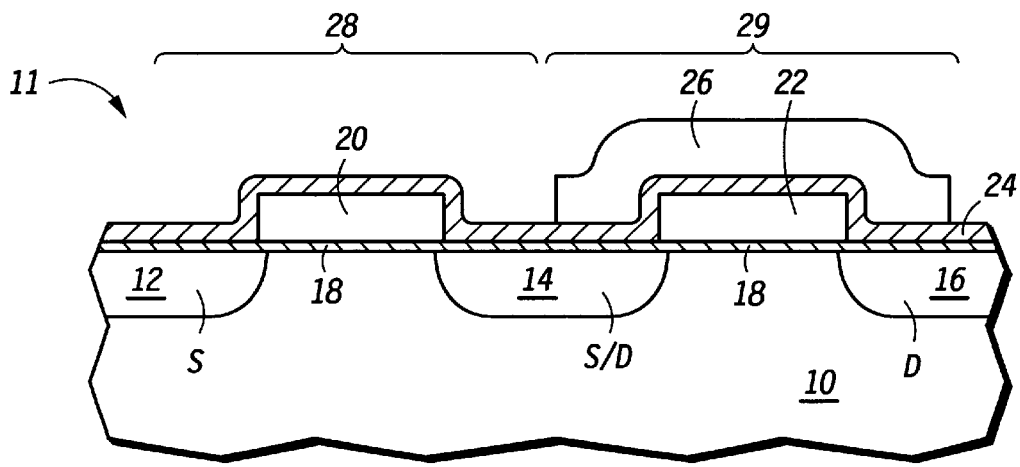
FIG. 1 includes an illustration of a cross-sectional view of a memory cell (prior art)
FIG. 2 includes a table illustrating the operating potentials of the memory cell in FIG. 1 (prior art)
Figure 3:
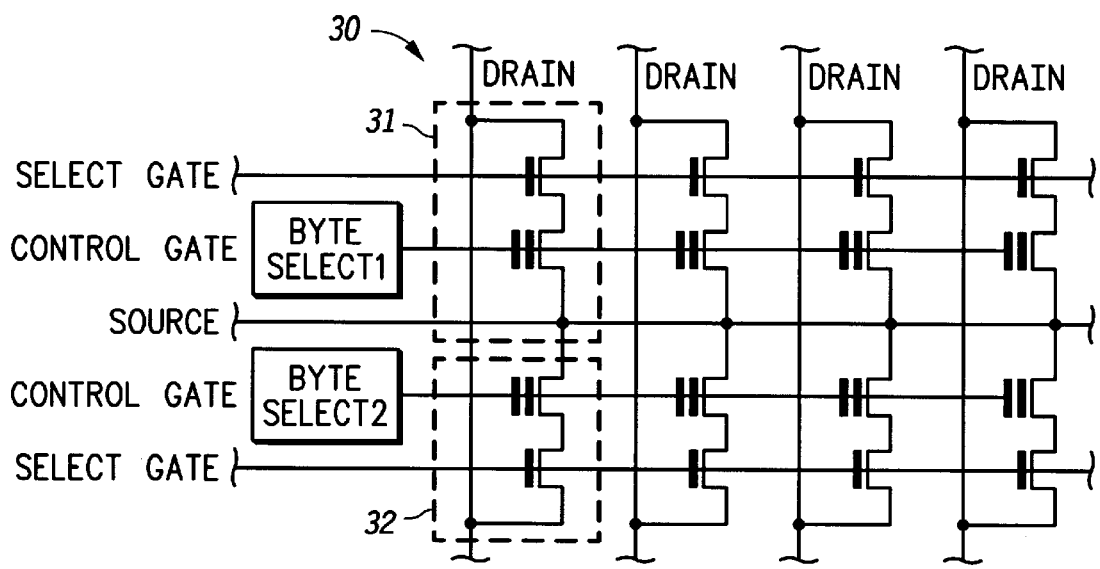
FIG. 3 includes a portion of a memory array of floating gate memory cells.

FIG. 3 includes a portion of a memory array 30 that includes a plurality of electrically erasable and electrically programmable read only memory cells. The portion of memory array 30 shown in FIG. 3 has eight memory cells oriented with four memory cells along each row and two memory cells along each column.

The drain bit lines of the memory cells are connected along common columns, and two adjacent rows of memory cells share a common source. The select gates and control gates are oriented along the rows. The select gates span the entire lengths of the rows, whereas the control gates are broken into segments of multiple bits that are erased concurrently. The dashed lines correspond to a first memory cell 31 and a second memory cell 32. The various control gates are selected with select circuitry, named BYTE SELECT 1 and BYTE SELECT 2, that is conventional in the prior art. All other circuitry not shown in FIG. 3, such as column address, row address, erase circuitry, sense amplifiers, and the like, lie outside the memory cells and are conventional in the art.

Figure 4:
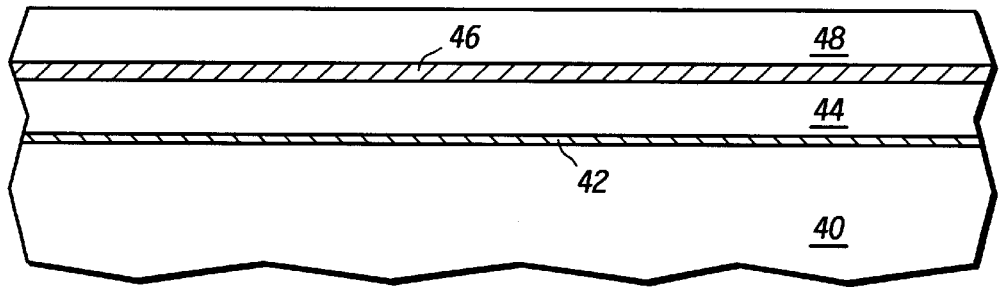

Attention is now directed to a method of fabricating the semiconductor device that includes the floating gate nonvolatile memory cells. Although the description below focuses on one memory cell, the other cells within memory array 30 are formed during the same steps. FIG. 4 includes a P-well region 40 within a semiconductor device substrate (not illustrated). The semiconductor device substrate includes a monocrystalline semiconductor wafer, a semiconductor-on-insulator wafer or any other substrate used for forming a semiconductor device. Alternatively, the combination of the P-well region 40 and substrate could be replaced by a p-type monocrystalline semiconductor substrate.

A tunnel dielectric layer 42 is formed over a portion of the P-well region 40 and includes oxide, nitride, oxynitride, refractory metal oxides, or the like. The thickness of the tunnel dielectric layer 42 is typically less than 200 angstroms, and is more often in a range of approximately 40–120 angstroms. A first conductive layer 44 is deposited over the tunnel dielectric layer 42. The first conductive layer 44 is typically a doped silicon layer, such as amorphous silicon, polycrystalline silicon, and the like. An intergate dielectric layer 46 is then formed over the first conductive layer 44. The intergate dielectric layer 46 includes silicon dioxide, a nitride, a combination of thereof, a refractory metal oxide, or the like. Typically, the electrically measured oxide equivalent thickness of layer 46 is usually less than 200 angstroms thick. A second conductive layer 48 is formed over the intergate dielectric layer 46. The second conductive layer 48 includes doped silicon, metals, metal suicides, or the like.

Figure 5:
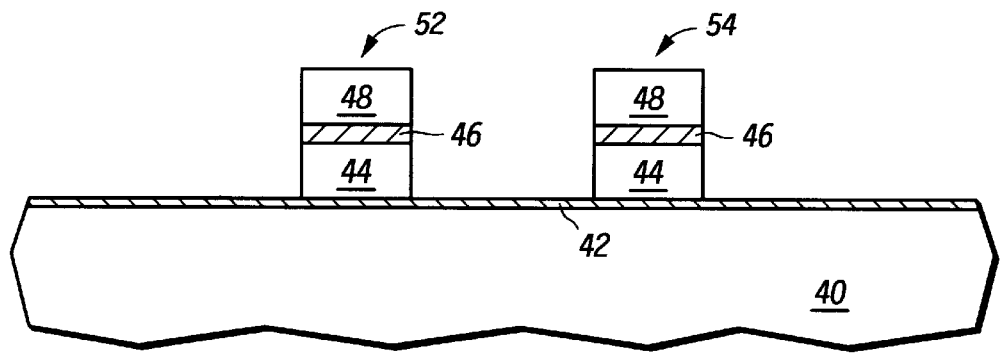

The first and second conductive layers 44 and 48 and the intergate dielectric layer 46 are then patterned using a stacked gate etching sequence to form a first gate structure 52 and a second gate structure 54 as illustrated in FIG. 5. The etching sequence typically includes at least three etching steps to etch through layers 44, 46, and 48 during a single evacuation cycle. Alternatively, the layers 44, 46, and 48 could be etched during discreet etching sequences using a plurality of evacuation cycles. The sides of the layers 44 and 48 of the gate structure 52 in FIG. 5 are substantially coplanar. A similar coplanarity relationship holds for the sides of gate structure 52 and each of the left-hand and right-hand sides of gate structure 54. An oxide layer 60 is then formed along exposed portions of the gate structures 52 and 54 as shown in FIG. 6. The oxide layer 60 is formed by thermal oxidation or by chemical vapor deposition.

At this point in the process, the formation of n-type doped regions 64, 66 and 68 will depend upon the technology used to form the memory cell. The n-type doped regions 64, 66, and 68 are the source, drain/source, and drain regions, respectively, for the memory cell. Although spacers 62 are shown in FIG. 6, their formation is optional. The processing steps used to form the doped regions 64, 66, and 68 and spacers 62 are conventional for those skilled in the art.

At this point, the storage transistor 65 and the select transistor 67 have been formed. The storage transistor 65 includes a floating gate 651 and a control gate 652. Note that the control gate 652 is typically part of a word line either for an individual byte or for a plurality of bytes along the same row. The select transistor 67 includes the select gate 671. A conductive member 672 overlies the select gate 671. The conductive member 672 and the control gate 652 consist essentially of the same materials because both are formed from portions of the second conductive layer 48. The significance of conductive member 672 will be described later.

Processing continues to form a substantially completed semiconductor device 70 as illustrated in FIG. 7. An inter-level dielectric layer 72 is formed over the transistors and is subsequently patterned to define a contact opening 74 extending to the drain region 68. A conductive plug 76 is then formed to make electrical contact to the drain region 68. The first interconnecting level 78 is formed and is electrically connected to the drain region 68. The first interconnecting level 78 is part of a drain bit line for the memory array. After forming the first interconnect level 78, a passivation layer 79 is formed over the first interconnect level 78. Other electrical connections are made to other portions of the semiconductor device 70 but are not illustrated in FIG. 7. For example the source region 64 will be electrically connected to other portions of the common source region 64, and electrical connections to the control gate 652 and select gate 671 are also made but not illustrated in FIG. 7. Additional interlevel dielectric layers and interconnecting levels can be formed, if needed. The passivation layer 79 is formed over the uppermost interconnecting level.

Note that the conductive member 672 and the select gate 671 are electrically connected to one another as shown in FIG. 7. The electrical connection is made to electrically short the two and this electrical connection is made outside the memory cell, but is schematically illustrated in FIG. 7. Further, the plurality of conductive layers reduces the resistance of the select gate 671. Electrical connections between the two layers can be made for nearly any interval of memory cells, such as once every 16, 32 or 64 memory cells.

Many other designs of the memory cells are possible. Returning to FIG. 5, during the formation and patterning steps of the control gate 652, floating gate 651, and select gate 671, the etching steps can be performed such that non-self aligned etches are used for forming the floating gate 651 and select gate 671. More specifically, the floating gate 651 and select gate 671 are patterned after depositing the first conductive layer 44. The intergate dielectric layer 46 would then be deposited over the floating gate 651, and the second conductive layer 48 would be deposited over the intergate dielectric layer 46. The second conductive layer 48 would then be patterned to form a control gate 652 that lies over and along the sides of the floating gate. In this particular structure, there would not be a second conductive layer overlying the select gate as shown in FIG. 5.

Alternatively the select gate 671 could be formed during the formation of the control gate 652. In this particular embodiment, the first conductive layer 44 would be deposited and patterned to form the floating gate 651. The intergate dielectric layer 46 would then be formed over the floating gate 651, and a separate thin dielectric layer is formed over the select gate area. The second conductive layer 48 would then be deposited and patterned to form the control gate 652 and select gate 671. The gate dielectric layers for the storage and select transistors have approximately the same thickness. Alternatively, the tunnel dielectric layers can have different thicknesses but are typically no greater than approximately 200 angstroms, and more specifically are typically in a range of approximately 40–120 angstroms.

OPERATION OF MEMORY CELLS

The operation of the memory array can be seen with the operating potentials in FIG. 8. The potentials applied during selective programming of memory array 30. Referring to FIG. 3, memory cell 31 is to be programmed (selected), and memory cell 32 is not to be programmed (unselected). Note that memory cells 31 and 32 share the same drain bit line.

For memory cell 31, the control gate is placed at a potential ($V_{CG}$) in a range of approximately −9 to −14 volts, the drain is at a potential ($V_D$) in a range of approximately 0.9 to 3.3 volts, the select gate is at a potential ($V_{SG}$) that is about 0.5 to 2 volts higher than $V_D$. The select gate typically will be at a potential higher than the drain potential by at least the back-biased threshold voltage of the select transistor. For example, if the select transistor has a threshold voltage of approximately 0.5 volts, the select gate should be at least approximately 0.7 volts higher than the drain potential to allow the proper biasing of the drain/source region. Because the select gate transistor is located between the drain contact and the storage transistor, the drain disturb problem during programming is eliminated. Because the drain potential is relatively lower compared to the prior art, the dielectric thickness of the select transistor can be lower than in the prior art.

The potentials of the source region and P-well region ($V_S$) and ($V_{WELL}$) are approximately zero volts. During the programming of memory cell 31, $V_D$, $V_S$, and $V_{WELL}$ for memory cell 32 are the same as memory cell 31. However, $V_{CG}$ and $V_{SG}$ for memory cell 32 are approximately zero volts Specific potentials for one embodiment are seen in FIG. 8.

To erase memory cell 31, $V_{CG}$ is in a range of approximately 9–14 volts, and $V_{SG}$ is in a range of approximately 0.9–3.3 volts, while the $V_D$, $V_S$, $V_{WELL}$ are at approximately zero volts. During a read operation for memory cell 31, $V_{CG}$ is typically in a range of approximately 0–2 volts, $V_{SG}$ is approximately the $V_{DD}$ potential, and $V_D$ is approximately 1 volt.

The zero volt potential can be achieved by placing the appropriate regions at the $V_{SS}$ potential. The $V_{DD}$ potential is typically 3.3 volts and is expected to migrate eventually to 0.9 volts.

Embodiments of the present invention allow a memory cell to be formed that does not have a drain disturb problem associated with programming of other memory cells along the same drain bit line because $V_D$ is no higher than 3.3 during programming. This can be highly useful for memory cells that are used in byte erasable or bit erasable devices. When other memory bytes along the drain bit line are frequently programmed, the possibility of disturbing the data within a byte not being programmed greatly increases with the number of rows. A worse case for reliability testing of a part with 512 rows seeing a programming time of approximately 10 milliseconds per cell would effectively have to withstand six days continuously at the drain potential during programming of the other cells on the same drain bit line 100,000 times. Although the difference in drain potential from 6 volts to 3 volts does not appear that tremendous, this greatly reduces the amount of drain disturb problems. Note however, that the present invention is not limited only to bit-erasable or byte-erasable memory arrays. The same design may be used for memory arrays that are row erasable, column erasable, or block erasable. Therefore the present invention allows a wide variety of memory layouts to be used that have a reduced likelihood of a drain disturb problem during programming.

The relatively thin tunnel dielectric layer beneath the select gate allows a relatively low voltage transistor to be used to allow for a faster operating time particularly during read operations. The embodiments of the present invention also do not have the issues related to a high potential of the select gate during programming. For example, in a prior art, a memory cell's select gate is taken to a potential having approximately the same magnitude as its control gate. Should this happen, a tunnel dielectric layer thickness may not be adequate because the high potential on the select gate would cause a tunnel dielectric break down that would render the device non-functional. Therefore, by keeping the potential of the select gate relatively low during programming, the likelihood of a tunnel dielectric rupture should be reduced. Otherwise, a significantly thicker gate dielectric layer, such as approximately 300 angstroms, is required to prevent break down. However such a thick gate dielectric layer will slow the operation of the device and is undesired. Therefore, the embodiments of the present invention have the benefits of being resistant to drain disturb problems during programming and have relatively quick access times using relatively lower potentials that are required for future generations of floating gate memory cells and in particular for devices used in portable applications electronic devices.

The conductivity types of the semiconductor device can be reversed. If the conductivity types of the regions 40, 64, 66, and 68 are reversed, the polarities of the operating potentials are also reversed, however, the absolute values of the potentials should not be changed.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. In the claims, means-plus-function clause(s), if any, cover the structures described herein that perform the recited function(s). The mean-plus-function clause(s) also cover structural equivalents and equivalent structures that perform the recited function(s).

What is claimed is:

1. A method of operating a memory array, wherein the method includes selectively programming the memory array that includes a first memory cell to be programmed and a second memory cell that is not to be programmed, the selectively programming comprising:

providing a memory array including the first and second memory cells, wherein:
    each of the first and second memory cells includes:
        a source region, a drain/source region, and a drain region;
        a floating gate overlying portions of the source region and the drain/source region;
        a control gate overlying the floating gate and portions of the source region and the drain/source region; and
        a select gate overlying portions of the drain/source region and the drain region; and
    the drain regions of the first and second memory cells are electrically connected to each other;

placing the drain regions of the first and second memory cells at a first potential having a first polarity;

placing the source regions of the first and second memory cells at a second potential of approximately zero volts;

placing the control gate of the first memory cell at a third potential having a second polarity that is opposite the first polarity;

placing the select gate of the first memory cell at a fourth potential having the first polarity, wherein the fourth potential is no higher than approximately eight volts;

placing the control gate of the second memory cell at a fifth potential having an absolute value less than the first potential; and placing the select gate of the second memory cell at a sixth potential having an absolute value less than the first potential.

2. The method of claim 1, wherein:

the first potential has an absolute value in a range of approximately 0.9 to 3.3 volts;

the third potential has an absolute value in a range of approximately 9 to 14 volts; and the fourth potential has an absolute value in a range of approximately 0.5 to 2 volts higher than the first potential.

3. The method of claim 1, further comprising erasing the first memory cell including:

placing the source region and the drain region of the first memory cell at the second potential;

placing the control gate of the first memory cell at an eighth potential having the first polarity; and placing the select gate of the first memory cell at a ninth potential having a first polarity.

4. The method of claim 3, wherein:

each of the first and ninth potentials has an absolute value in a range of approximately 0.9 to 3.3 volts;

each of the third and eighth potentials has an absolute value in a range of approximately 9 to 14 volts; and the fourth potential has an absolute value in a range of approximately 0.5 to 2 volts higher than the first potential.

5. The method of claim 3, wherein the memory array is selected from a group consisting of a byte-erasable memory array and a bit-erasable memory array.

6. The method of claim 1, wherein the memory array further comprises a substrate and a tunnel dielectric layer, wherein the tunnel dielectric layer:

lies between the substrate and the floating gate and also lies between the substrate and the select gate; and has a thickness less than approximately 200 angstroms.

7. The method of claim 1, wherein the tunnel dielectric layer has a thickness in a range of approximately 40–120 angstroms.

8. A semiconductor device including a memory cell, wherein the memory cell comprising:

a first dielectric layer over a substrate;

a floating gate overlying the first dielectric layer;

a select gate overlying the first dielectric layer;

an intergate dielectric layer including a first portion and a second portion, wherein:
the first portion overlies the floating gate; and
the second portion overlies the select gate;

a control gate overlying the floating gate and the first portion of the intergate dielectric layer; and a conductive member overlying the select gate and the second portion of the intergate dielectric layer, wherein the conductive member is electrically connected to the select gate.

9. The semiconductor device of claim 8, wherein:

the intergate dielectric layer is an only layer lying between the select gate and the conductive member.

10. The semiconductor device of claim 8, further comprising a source region, drain/source region, and drain region for the memory cell, wherein:

the source region, drain/source region, and drain region lie within the substrate;

the floating gate overlaps the source and drain/source regions; and the select gate overlaps the drain/source and drain regions.

11. The semiconductor device of claim 8, wherein the first dielectric layer includes a tunnel dielectric layer having a thickness less than approximately 200 angstroms.

12. The semiconductor device of claim 8, wherein the first dielectric layer includes a tunnel dielectric layer having a thickness in a range of approximately 40–120 angstroms.

* * * * *